United States Patent [19]
Hanrahan et al.

[11] Patent Number: 6,163,160
[45] Date of Patent: Dec. 19, 2000

[54] ADJUSTABLE TOOLING PIN

[75] Inventors: Dennis P. Hanrahan, Walnut Creek; Alexander D. Kristal, San Ramon, both of Calif.

[73] Assignee: Teradyne, Inc., Boston, Mass.

[21] Appl. No.: 09/204,977

[22] Filed: Dec. 3, 1998

[51] Int. Cl.⁷ .................................................. G01R 31/02
[52] U.S. Cl. ............................................ 324/758; 324/761
[58] Field of Search .................................... 324/758, 761, 324/762; 269/47, 50–52; 33/645

[56] References Cited

U.S. PATENT DOCUMENTS

| | | | |
|---|---|---|---|
| 5,239,261 | 8/1993 | Murdock et al. | 324/758 |
| 5,395,099 | 3/1995 | Hall | 369/47 |
| 5,892,366 | 4/1999 | Byers | 324/758 |
| 5,949,244 | 9/1999 | Miley | 324/762 |

*Primary Examiner*—Safet Metjahic
*Assistant Examiner*—Anjan Deb
*Attorney, Agent, or Firm*—Legal Department

[57] ABSTRACT

A tooling pin assembly used with a receiver in a printed circuit board tester is disclosed. The tooling pin assembly includes a locating pin with a core threaded to receive a screw, and a bushing for supporting and guiding the locating pin relative to the receiver. When the screw is rotated in one direction, the locating pin moves out of the bushing and passes through a hole in the receiver for engaging a test fixture. When the screw is rotated in the opposite direction, the locating pin retracts into the bushing until it is below the plane of the receiver. The ability to extend and retract the locating pin is especially useful when the tooling pin assembly is used with a receiver designed to hold test fixtures of various sizes.

20 Claims, 4 Drawing Sheets

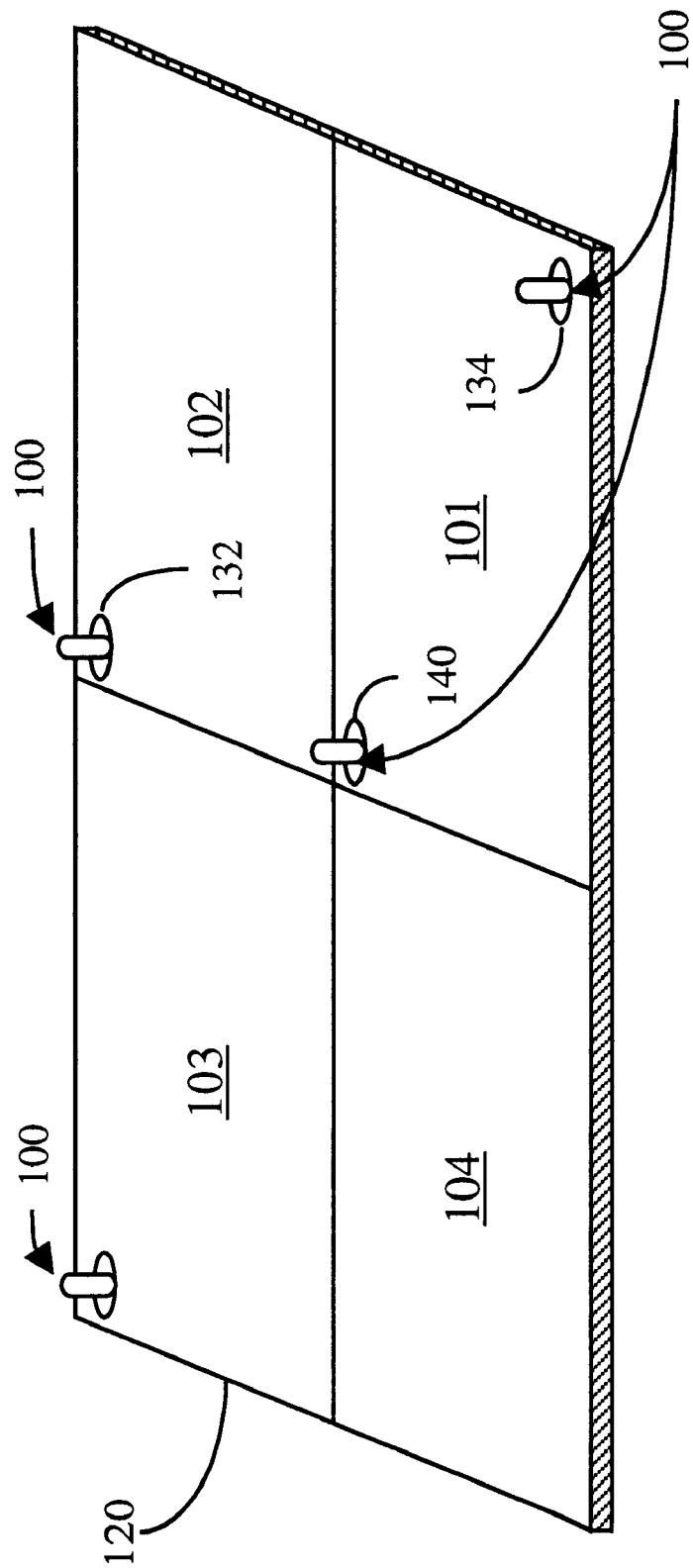
FIG. 1 - PRIOR ART

ADJUSTABLE TOOLING PIN

This invention relates generally to automatic test equipment and more particularly to tooling pin hardware for positioning and holding a test fixture for a printed circuit board under test.

FIG. 1 shows a test system receiver 120 that may be used to hold a test fixture (not shown) in a fixed position during testing of a printed circuit board. Such a receiver is found in the SPECTRUM™ 8800-Series of printed circuit board testers sold by TERADYNE®, Inc., Walnut Creek, Calif., USA. In particular, the receiver 120 includes quadrants 101, 102, 103, and 104 as generally shown in FIG. 1. Further, the receiver 120 includes multiple tooling pins, such as the pins 100, that may pass through locating holes in the test fixture, thereby holding the test fixture in a fixed position during the test.

The receiver 120 can hold test fixtures of different sizes. Further, when a test fixture is placed upon the receiver 120, a pair of tooling pins 100 typically pass through holes located at diagonally opposing corners of the test fixture.

Accordingly, a small test fixture (not shown) might be placed upon quadrant 101 and held in a fixed position by the pins 100 in diagonally opposing corners of quadrant 101. Similarly, a test fixture of intermediate size (not shown) might be placed upon quadrants 101 and 102 and held in position by the pins 100 in the lower right-hand corner of quadrant 101 and the upper left-hand corner of quadrant 102. Further, a large test fixture (not shown) might be placed upon the quadrants 101, 102, 103, and 104, and held in position by the pins 100 in the lower right-hand corner of quadrant 101 and the upper left-hand corner of quadrant 103.

One shortcoming of the receiver 120 is that the intermediate size test fixture must have an additional hole to provide clearance for the pin 100 in the upper left-hand corner of quadrant 101. Similarly, the large test fixture must have additional holes to provide clearance for the pins 100 in the upper left-hand corner of quadrant 101 and the upper left-hand corner of quadrant 102.

Because a pair of tooling pins passing through holes located at diagonally opposing corners of a test fixture is usually sufficient to hold the test fixture in a fixed position on a receiver during a test, it may be redundant to provide clearance holes for tooling pins at other locations on the test fixture. Further, these clearance holes take up space that might otherwise be used by conductive traces on the test fixture. Still further, such clearance holes generally add to the cost of a test fixture because additional manufacturing steps are required to form them.

A tooling pin assembly is described in U.S. Pat. No. 5,395,099 issued Mar. 7, 1995. That patent discloses a tooling pin assembly for positioning a printed circuit board relative to a test platen. Further, the tooling pin assembly has a spring that is biased to push the tooling pin outward. For example, the spring-biased tooling pin may be depressed into the assembly so that the tooling pin is out of the plane of the test platen. Further, when the depressed tooling pin is aligned with a locating hole in a printed circuit board under test the spring forces the tooling pin outward into and through the locating hole.

However, this approach also has some shortcomings. For example, if the depressed tooling pin is not aligned with holes located at diagonally opposing corners of the BUT and is instead aligned with some other intermediate location on the BUT where there is no hole, then the spring may cause the tooling pin to push against the BUT, thereby damaging the BUT. Even if the BUT were not damaged, the spring-loaded tooling pin might cause the BUT to move from its proper position relative to the test fixture interface. Further, such a spring-loaded tooling pin most likely would not be strong enough to hold and position a test fixture, which in some cases can weigh over 100 lbs.

It would therefore be desirable to have a test system receiver with tooling pins that can hold and position a test fixture during a test. Such a receiver would be able to hold and position test fixtures of various sizes without requiring clearance holes for tooling pins at intermediate locations on the test fixtures.

SUMMARY OF THE INVENTION

With the foregoing background in mind, it is an object of the invention to provide a test system receiver that can hold a test fixture in a proper fixed position relative to a tester interface.

Another object of the invention is to provide a receiver that can accommodate test fixtures of various sizes during testing.

Still another object of the invention is to provide a receiver that is easy and inexpensive to manufacture.

The foregoing and other objects are achieved in a test system receiver having tooling pin assemblies located at a plurality of locations on the receiver. The tooling pin assemblies are located to allow the receiver to hold and position test fixtures of various sizes relative to a tester interface. Each tooling pin assembly includes a bushing attached to the receiver with a plug at one end; a screw positioned coaxially with the bushing having a shank portion passing through the plug and a threaded portion located substantially within the bushing; and, a locating pin with a threaded core for receiving the threaded portion of the screw. By rotating the screw, the locating pin can either be lowered into the bushing or raised out of the bushing. In the lowered position, the locating pin is out of the plane of the receiver. In the raised position, the locating pin passes through a hole in the receiver a sufficient amount for holding and positioning a test fixture.

According to one feature, the locating pin is a steel, diamond-shaped pin.

According to another feature, the bushing includes hard stops for the locating pin in both the raised and lowered positions.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a perspective view of a conventional test system receiver;

DESCRIPTION OF THE PREFERRED EMBODIMENT

Figure 2A:
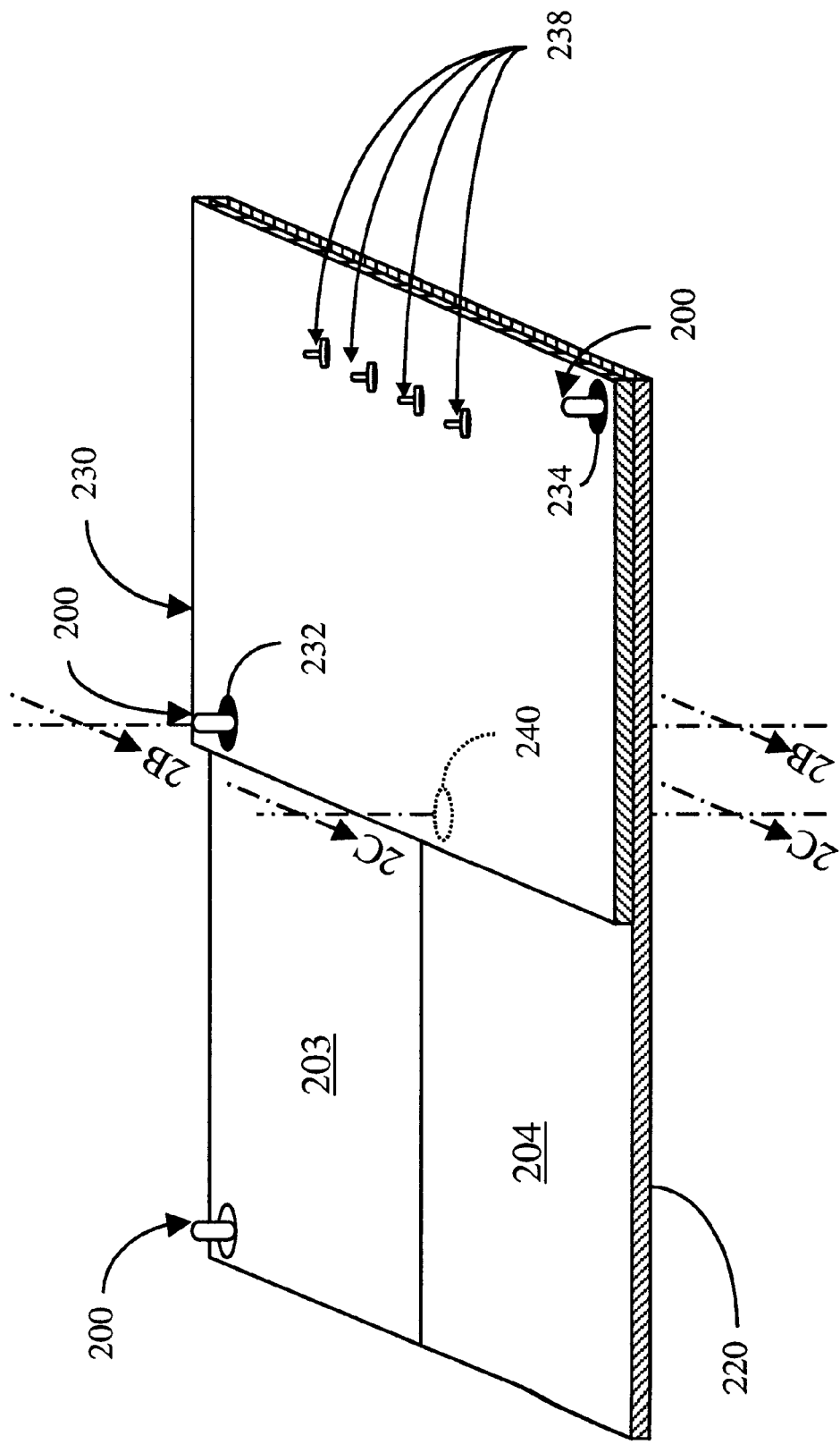
FIG. 2A is a perspective view of a portion of a test fixture resting on a test system receiver in accordance with the present invention.

FIG. 2A shows a test system receiver 220 in accordance with the invention. The receiver 220 includes quadrants 201 (not shown), 202 (not shown), 203, and 204, which generally correspond with quadrants 101, 102, 103, and 104 shown on prior receiver 120 in FIG. 1.

The receiver 220 also includes a plurality of novel tooling pin assemblies 200 located at useful positions on the receiver 220. The locations of the tooling pin assemblies 200 on the receiver 220 generally correspond with the locations of tooling pin assemblies 100 on the prior receiver 120. These locations preferably correspond with locating holes in diagonally opposing corners of test fixtures of various sizes.

The receiver 220 may be used with test fixtures of the type that incorporate a printed wiring board having pads on its lower side for making electrical contact with probes on a tester interface, and probes on its upper side for making electrical contact with pads on a printed circuit board under test (BUT). Such test fixtures are commonly known as "wireless" test fixtures.

Accordingly, a wireless test fixture 230 is shown resting on the receiver 220 and generally covering quadrants 201 and 202 (not shown) of the receiver 220. The test fixture 230 includes contact pads (not shown) on its lower surface (not shown) and probes 238 on its upper surface. The probes 238 typically make electrical contact with selected nodes on a BUT (not shown), which is generally a printed circuit board assembly with many electronic components (not shown) attached to it. In this way, the test fixture 230 may apply and measure signals or levels at the selected nodes during testing. For example, the test fixture 230 may be used to perform in-circuit or functional testing on the BUT.

The test fixture 230 includes locating holes 232 and 234 preferably located at diagonally opposing corners of the test fixture 230. The diameters of the locating holes 232 and 234 are shown exaggerated for clarity. In the preferred embodiment, the diameters of the locating holes 232 and 234 are sufficient to provide clearance for locating pins included in the tooling pin assemblies 200 while allowing the locating pins to hold the test fixture 230 in a fixed position relative to the tester interface during testing.

Figure 2C:
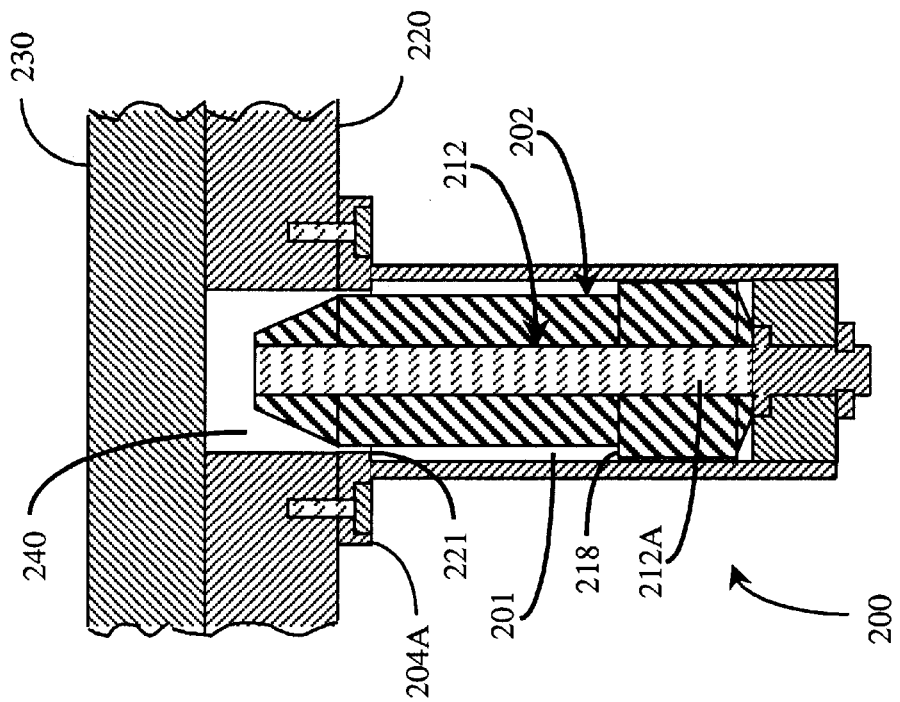
FIG. 2C is a cross-sectional view of a tooling pin assembly according to the present invention taken along line 2C—2C of FIG. 2A.
Figure 2B:
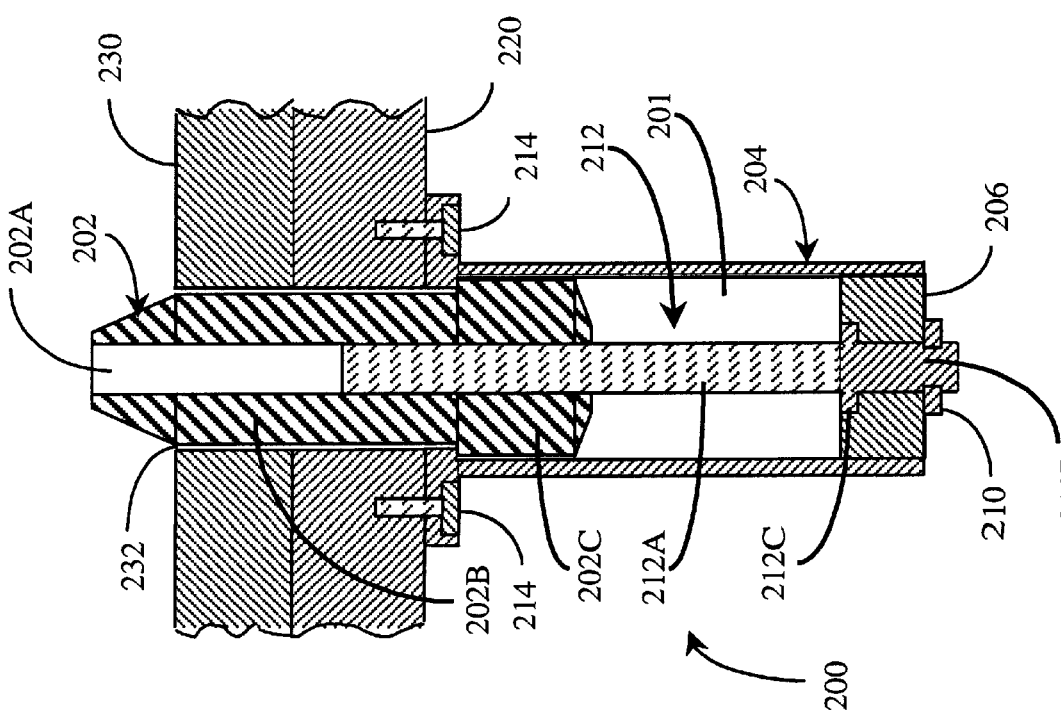
FIG. 2B is a cross-sectional view of a tooling pin assembly in accordance with the present invention taken along line 2B—2B of FIG. 2A.

FIG. 2B shows a cross-sectional view of the tooling pin assembly 200 corresponding to the locating hole 232 in the upper left-hand corner of the test fixture 230. The tooling pin assembly 200 is shown with a fully extended locating pin 202 passing through both an opening in the receiver 220 and the locating hole 232 in the test fixture 230.

The locating pin 202 preferably includes an elongated portion 202B and a portion 202C having a diameter slightly larger than that of the elongated portion 202B, thereby forming a step 218 (see FIG. 2C). Further, the locating pin 202 has a threaded core 202A extending through the portion 202C and extending substantially through the elongated portion 202B for receiving a threaded portion 212A of a screw 212.

Both the locating pin 202 and the screw 212 are supported by a bushing 204, which also serves as a guide for the locating pin 202. The bushing 204 is attached to the receiver 220 in any suitable manner. For example, a rim portion 204A (see FIG. 2C) of the bushing 204 is shown attached to the receiver 220 by screws 214. Further, the rim 204A of the bushing 204 forms a step 221 (see FIG. 2C). The bushing 204 may be made of any suitable material, such as bronze.

A plug 206 has an opening that is sized to receive a shank portion 212B of the screw 212 while allowing enough clearance for the shank 212B to rotate. The free end of the shank 212B preferably has features (not shown) that allow a tool (not shown) to grasp the shank 212B and rotate the screw 212. Further, the shank 212B includes an annular portion 212C.

In the preferred embodiment, the tooling pin assembly 200 is assembled by inserting the shank 212B into the opening of the plug 206 until the annular portion 212C is flush with the surface of the plug 206. A retaining ring 210 is then pressed onto the shank 212B. The annular portion 212C of the shank 212B and the retaining ring 210 therefore secure the screw 212 to the plug 206.

Next, the threaded portion 212A of the screw 212 is screwed into the threaded core 202A of the locating pin 202 preferably until the locating pin 202 makes contact with the plug 206 (see FIG. 2C). The locating pin 202 and the screw 212 in combination are then inserted into the bushing 204, and the plug 206 is pressed into the bushing 204 until it is flush with the edge of the bushing 204. Consequently, the locating pin 202 and the screw 212 extend substantially through the bushing 204.

Finally, the bushing 204 is attached to the receiver 220 at one of the useful positions mentioned above. For example, FIG. 2B shows the tooling pin assembly 200 attached to the receiver 220 so that the locating pin 202 is in registration with the hole 232. Similarly, FIG. 2C shows the tooling pin assembly 200 attached to the receiver 220 so that the locating pin 202 is in registration with a hole 240 (also shown in shadow in FIG. 2A) in the receiver 220.

Figure 3:
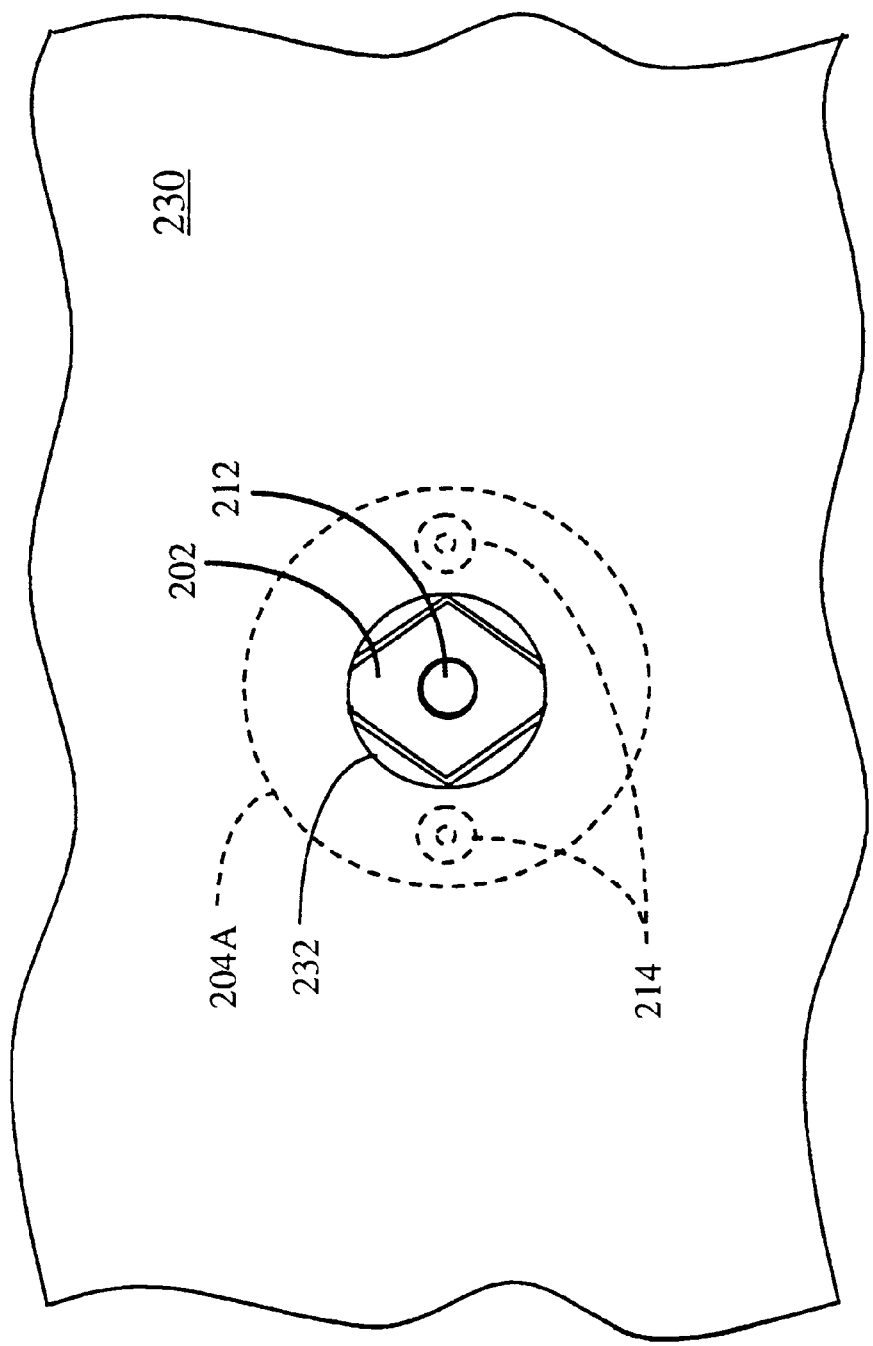
FIG. 3 is a top view of the test fixture and one of the tooling pin assemblies shown in FIG. 2A.

FIG. 3 is a top view of a portion of the test fixture 230 encompassing the locating hole 232. The rim 204A of the bushing 204 and the screws 214 attaching it to the underside of the receiver 220 are shown in shadow. Further, a top view of the locating pin 202 and the screw 212 in core 202A are shown.

FIG. 3 shows that the locating pin 202 is preferably diamond-shaped. This aids the locating pin 202 in holding the test fixture 230 in a fixed position relative to the tester interface during a test. Further, both the locating pin 202 and the screw 212 may be made of any suitable material. For example, the locating pin 202 may be a steel diamond pin; and, the screw 212 may be made of bronze.

A human operator can use the receiver 220 to hold and position a test fixture as follows. First, the operator uses an appropriate tool to rotate screws 212 in respective tooling pin assemblies 200 attached to the receiver 220, thereby lowering corresponding locating pins 202 into the bushings 204 of the respective tooling pin assemblies. The plug 206 provides a hard stop for the locating pin 202 in its lowered position. Consequently, each of the locating pins 202 is out of the plane of the receiver 220. FIG. 2C shows a tooling pin assembly 200, in registration with the hole 240 in the receiver 220, with the locating pin 202 in its lowered position within the bushing 204 and against the plug 206.

Next, the operator chooses a test fixture such as the test fixture 230 and raises the locating pins that will be used to hold and position the chosen test fixture. For example, the operator rotates the screws 212 of the tooling pin assemblies 200 that will be in registration with locating holes in the chosen test fixture, thereby raising the corresponding locating pins 202 out of the bushings 204. The operator then places the chosen test fixture on the receiver, thereby causing the raised locating pins to pass through the locating holes in the test fixture.

For example, FIG. 2A shows locating pins 202 in their raised positions passing through the locating holes 232 and 234 of the test fixture 230. Further, FIG. 2B shows a tooling pin assembly 200, in registration with the locating hole 232, with the locating pin 202 in its raised position. The step 221 formed by the rim 204A provides a hard stop for the step 218 formed by the lower portion 202C of the locating pin 202.

In this way, the tooling pin assemblies 200 in opposing corners of the test fixture 230 are manipulated to hold the test fixture 230 in a fixed position relative to the tester interface. Further, because the tooling pin assembly 200 in registration with the hole 240 has a locating pin 202 below the plane of the receiver 202, a clearance hole through the test fixture 230 is not required at this location. In fact, the locating holes 232 and 234 are the only holes that are required through the test fixture 230 to secure it to the receiver 220. This eliminates the need to form additional holes through the test fixture 230, and ensures that a maximum amount of the test fixture 230 is available for conductive traces.

Having described one embodiment, numerous alternative embodiments or variations might be made. For example, it was described that the receiver 220 includes quadrants 201, 202, 203, and 204. However, this was merely an illustrative example to facilitate the demonstration of the benefits of the receiver 220 over the prior receiver 120. The test system receiver of the present invention may include more or fewer quadrants depending upon the sizes of the test fixtures it is designed to hold.

In addition, it was described that the receiver 220 includes a plurality of tooling pin assemblies 200 at locations corresponding with the locations of the tooling pin assemblies 100 on the prior receiver 120. However, this was also merely an illustrative example and other locations for the tooling pin assemblies are possible.

In addition, it was described that the receiver 220 is for holding and positioning a test fixture 230. However, this was merely an illustrative example. The test system receiver of the present invention may also hold "personality plates," which are typically used as adapters for various test fixtures.

In addition, it was described that the locating pin 202 and the screw 212 are supported and guided by the bushing 204. In an alternative embodiment, the bushing 204 may be designed to be sealed. This is especially advantageous when the receiver 220 is used with the TERADYNE® SPECTRUM™ 8800-Series of printed circuit board testers, which have a vacuum-actuated tester interface. Further, the sealed bushing helps keep the steel diamond pin in a proper orientation relative to the test system receiver.

In addition, it was described that the bushing 204 and the screw 212 may be made of bronze, the locating pin 202 may be made of steel, and screws may be used to attach the bushing 204 to the receiver 220. However, this was also merely an illustrative example. The bushing, the screw, and the locating pin may be made from different materials, and the bushing may be attached to the receiver in a different manner, so long as the resulting tooling pin and receiver combination is strong and durable enough to hold test fixtures of substantial size and weight.

Therefore, the invention should be limited only by the spirit and scope of the appended claims.

What is claimed is:

1. An interface for connecting a printed circuit board to a tester comprising:
 a receiver having a surface for supporting a test fixture; and
 a plurality of tooling pin assemblies attached to the receiver, each to ling pin assembly including
  a screw,
  a locating pin having a first elongated portion in axial alignment with a respective hole in the receiver, the locating pin having a threaded core for receiving the screw, and
  a cylindrical member for receiving and guiding the locating pin,
 whereby rotating the screw in one direction causes the first portion of the locating pin to move out of the cylindrical member and pass through the respective hole in the receiver, and rotating the screw in an opposite direction causes the first portion of the locating pin to move into the cylindrical member below the surface of the receiver.

2. The interface as recited in claim 1,
 wherein the first portion of the locating pin moves out of the cylindrical member a distance sufficient to engage the test fixture.

3. The interface as recited in claim 1,
 wherein the locating pin further includes a second portion that is wider than the first portion, and
 wherein a step is formed where the first portion of the locating pin meets the second portion.

4. The interface as recited in claim 3,
 wherein the step prevents the second portion of the locating pin from moving out of the cylindrical member.

5. The interface as recited in claim 1,
 wherein the cylindrical member includes a rim portion attached to the receiver, and
 wherein a step is formed inside the cylindrical member where the rim portion meets an elongated portion of the cylindrical member.

6. The interface as recited in claim 5,
 wherein the step forms a stop for the locating pin when the first portion of the locating pin is moved out of the cylindrical member.

7. The interface as recited in claim 1,
 wherein each tooling pin assembly further includes a plug inserted into one end of the cylindrical member for holding a shank portion of the screw.

8. The interface as recited in claim 7,
 wherein the plug forms a stop for the locating pin when the first portion of the locating pin is moved into the cylindrical member.

9. The interface as recited in claim 1,
 wherein the locating pin is a diamond steel pin.

10. The interface as recited in claim 1,
 wherein the screw is made of bronze.

11. The interface as recited in claim 1,
 wherein the cylindrical member is a bronze bushing.

12. A receiver for use in a printed circuit board tester, comprising:
 a surface for supporting a test fixture for a printed circuit board under test, and
 a plurality of tooling pin assemblies, each tooling pin assembly including
  a screw,
  a locating pin having a first elongated portion in registration with a respective hole in the receiver, the locating pin having a threaded core for receiving the screw, and
  a cylindrical member for receiving and guiding the locating pin, whereby rotating the screw in one direction causes the first portion of the locating pin to move out of the cylindrical member and pass through the respective hole in the receiver, and rotating the screw in an opposite direction causes the first portion of the locating pin to move into the cylindrical member below the surface of the receiver.

13. The receiver as recited in claim 12, wherein the locating pin further includes a second portion that is wider than the first portion, and wherein a step is formed where the first portion of the locating pin meets the second portion.

14. The receiver as recited in claim 12, wherein the cylindrical member includes a rim portion attached to the receiver, and wherein a step is formed inside the cylindrical member where the rim portion meets an elongated portion of the cylindrical member.

15. The receiver as recited in claim 12, wherein each tooling pin assembly further includes a plug inserted into one end of the cylindrical member for holding a shank portion of the screw.

16. A tooling pin assembly adapted to be mounted to a receiver portion of a printed circuit board tester, for holding a test fixture in a fixed position on a surface of the receiver, comprising:

a cylindrical member;

a locating pin disposed in the cylindrical member and in registration with a hole in the receiver, the locating pin having a first elongated portion and a threaded core; and a screw having a threaded portion disposed in the threaded core of the locating pin, whereby rotating the screw in a first direction causes the first portion of the locating pin to move out of the cylindrical member and pass through the hole in the receiver, and rotating the screw in an opposite direction causes the first portion of the locating pin to move into the cylindrical member below the surface of the receiver.

17. The tooling pin assembly as recited in claim 16, wherein the locating pin further includes a second portion that is wider than the first portion, and wherein a step is formed where the first portion of the locating pin meets the second portion.

18. The tooling pin assembly as recited in claim 16, wherein the cylindrical member includes a rim portion attached to the receiver, and wherein a step is formed inside the cylindrical member where the rim portion meets an elongated portion of the cylindrical member.

19. The tooling pin assembly as recited in claim 16, wherein each tooling pin assembly further includes a plug inserted into one end of the cylindrical member for holding a shank portion of the screw.

20. A method of manufacturing the tooling pin assembly as recited in claim 19, comprising the steps of:

(a) inserting the shank portion of the screw into an opening in the plug;

(b) inserting the threaded portion of the screw into the threaded core of the locating pin; and (c) inserting the locating pin, the screw, and the plug in combination into the cylindrical member until the plug is flush with an edge of the cylindrical member.

* * * * *